(12) United States Patent
Shenoy et al.

(10) Patent No.: US 11,262,405 B2
(45) Date of Patent: Mar. 1, 2022

(54) FAULT DETECTION IN A MULTI-PHASE ELECTRIC MACHINE

(71) Applicant: Calnetix Technologies, LLC, Cerritos, CA (US)

(72) Inventors: Suratkal P. Shenoy, Cerritos, CA (US); Liping Zheng, Buena Park, CA (US)

(73) Assignee: Calnetix Technologies, LLC, Cerritos, CA (US)

( * ) Notice: Subject to any disclaimer, the term of this patent is extended or adjusted under 35 U.S.C. 154(b) by 0 days.

(21) Appl. No.: 16/903,902

(22) Filed: Jun. 17, 2020

(65) Prior Publication Data
US 2021/0396809 A1 Dec. 23, 2021

(51) Int. Cl.
| | | |
|---|---|---|
| *G01R 31/34* | (2020.01) | |
| *G01R 19/00* | (2006.01) | |
| *G01R 19/165* | (2006.01) | |
| *G08B 21/18* | (2006.01) | |

(52) U.S. Cl.
CPC ......... *G01R 31/343* (2013.01); *G01R 19/003* (2013.01); *G01R 19/16523* (2013.01); *G01R 19/16528* (2013.01); *G01R 19/16547* (2013.01); *G08B 21/185* (2013.01); *G08B 21/187* (2013.01)

(58) Field of Classification Search
CPC ...... G01R 31/343; G01R 31/20; G01R 31/42; G01R 19/003; G01R 19/16523; G01R 19/16528; G01R 19/16457
USPC .................................................. 324/765.01
See application file for complete search history.

(56) References Cited

U.S. PATENT DOCUMENTS

| | | | |
|---|---|---|---|
| 8,085,517 B2 | 12/2011 | Weems et al. | |
| 8,232,752 B2* | 7/2012 | Kezobo | B62D 5/0487 |
| | | | 318/400.06 |
| 9,797,212 B2 | 10/2017 | Kraemer et al. | |
| 10,110,114 B2 | 10/2018 | MacLennan | |
| 10,211,800 B2 | 2/2019 | Wennerstrom et al. | |
| 10,536,053 B2 | 1/2020 | Shenoy et al. | |
| 2006/0197508 A1* | 9/2006 | Matsumoto | F02D 41/20 |
| | | | 323/201 |
| 2008/0304195 A1* | 12/2008 | Lin | H02M 1/4225 |
| | | | 361/89 |

(Continued)

OTHER PUBLICATIONS

U.S. Appl. No. 16/597,650, Shenoy et al., filed Oct. 9, 2019.

(Continued)

*Primary Examiner* — Thang X Le
(74) *Attorney, Agent, or Firm* — Fish & Richardson P.C.

(57) ABSTRACT

The present disclosure describes an apparatus, system, and method of use for detecting electrical faults in a multiphase electric machine. Often in platforms which require redundant reliability or have no readily available electrical connection to earth use ungrounded electrical architectures. This allows the system to continue normal operation even if there is an unintended short circuit or current path (electrical fault) between a phase of an electric machine and its case or some other part of the platform. It is important to be able to readily identify any fault in the phase windings of machinery operating in an ungrounded electrical architecture. Since a single fault in an ungrounded system will not cause any additional current draw or otherwise affect the system, it can be difficult to detect that a fault has even occurred. This provides an advanced warning system.

20 Claims, 4 Drawing Sheets

(56) References Cited

U.S. PATENT DOCUMENTS

| | | | |
|---|---|---|---|
| 2009/0134854 A1* | 5/2009 | Labuschagne | G05F 1/12 |
| | | | 323/255 |
| 2013/0314013 A1* | 11/2013 | Ajima | H02P 29/0241 |
| | | | 318/400.21 |
| 2016/0204689 A1 | 7/2016 | Wennerstrom et al. | |
| 2017/0234936 A1* | 8/2017 | Schrepfer | G01R 31/42 |
| | | | 324/764.01 |
| 2019/0238062 A1 | 8/2019 | Lu et al. | |

OTHER PUBLICATIONS

Shenoy et al.. "Commercializing Medium Voltage VFD that Utilizes High Voltage SiC Technology," Calnetix. 2017 International Workshop on Integrated Power Packing (IWIPP), 2017, 4 pages.

Sabri et al., "New Generation 6.5 kV SiC Power MOSFET", 2017 IEEE 5th Workshop on Wide-Bandgap Power Devices and Applications (WiPDA), 2017, 246-50.

* cited by examiner

FAULT DETECTION IN A MULTI-PHASE ELECTRIC MACHINE

TECHNICAL FIELD

This disclosure generally relates to a system for detecting faults in a multi-phase electric machine powered by a Variable Speed Drive Inverter which may be operating in an ungrounded configuration.

BACKGROUND

Modern electric architectures may use a centralized power source, such as a direct current (DC) bus to provide power to multiple electric machines. These machines may be multi-phase alternating current (AC) machines, which accept power from the centralized power source through an inverter, or other device. In some architectures, the centralized power source and the machines operating on it share a common ground. For example, the neutral of a three phase AC motor may be grounded to the case of that motor, which may be electrically connected to a ground associated with the power source. In this configuration, if there is a fault between one of the phases of the AC motor and the case, a large current draw, and decreased performance of the motor will be readily detectable. In other architectures, the entire system may be ungrounded. For example, there may be no electrical connection between the case of an AC machine and its associated neutral. Similarly the power source may operate in an ungrounded manner. This configuration can be advantageous because a single fault will not result in a large current or change in operation. A second fault, however, can have dire consequences, and a single fault in an ungrounded system can be difficult to detect and locate.

SUMMARY

The present disclosure involves systems, methods, and an apparatus for detecting faults in multi-phase electric machines. One example implementation includes a plurality of sensing circuits which each sense a voltage referenced to ground present in a particular phase winding of the multi-phase electric machine and provide a sensed voltage associated with that phase. An averaging circuit takes each sensed voltage and generates an average voltage representing an average of the sensed voltages. A set of comparators each accept the average voltage and a particular sensed voltage as input, and produce a signal (e.g., a warning signal) if the sensed voltage is lower than the average voltage.

Implementations can optionally include one or more of the following features.

In some instances, each comparator outputs a logical high if the comparator's associated sensed voltage is lower than the average voltage by greater than a predetermined threshold. The predetermined threshold can be selected such that the logical high represents a fault in the phase windings associated with the sensed voltage.

In some instances, a controller is configured to receive the signals produced by the comparators and initiate an action in response to receiving a logical high from one or more comparator outputs.

In some instances, the averaging circuit is an active averaging circuit with an overall gain of less or more than 1 (e.g., 0.9 or 1.2).

In some instances, each sensing circuit includes a voltage divider including at least two resistors and forming an intermediate node, a rectifier, which converts a bi-polar voltage to a single polarity voltage and an operational amplifier which is configured to be a buffer between the single polarity voltage and the output sensed voltage. The voltage divider can further include a capacitor which can be a low-pass filter, attenuating input frequencies above a predetermined cutoff frequency. The rectifier can be a full wave, diode rectifier including one or more filter capacitors.

In some instances, the sensed voltage provided by the sensing circuits is proportional to the voltage referenced to ground present in the particular phase winding.

The details of these and other aspects and embodiments of the present disclosure are set forth in the accompanying drawings and the description below. Other features, objects, and advantages of the disclosure will be apparent from the description and drawings, and from the claims.

DETAILED DESCRIPTION

This disclosure describes a system for detecting electrical faults in a multiphase electric machine. Often in platforms which require redundant reliability or have no readily available electrical connection to earth use ungrounded electrical architectures. This allows the system to continue normal operation even if there is an unintended short circuit or current path (electrical fault) between a phase of an electric machine and its case or some other part of the platform. In an ungrounded architecture if there is more than one fault however, a phase to phase connection, or other significant failure can occur. Therefore, it is important to be able to readily identify any fault in the phase windings of machinery operating in an ungrounded electrical architecture. Since a single fault in an ungrounded system will not cause any additional current draw or otherwise affect the system, it can be difficult to detect that a fault has even occurred. In contrast, a grounded system will experience large current draw on a faulted phase, which is readily detected by current sensors or other means.

The present disclosure describes a system for detecting electrical faults, in ungrounded systems and further for identifying the precise machine and phase that electrical fault is present in. Additionally, when a turn to turn fault exists in a particular phase, and the electric machine is a permanent magnet AC motor, the system can further identify which machine and phase the turn to turn fault is present in. This is accomplished by sensing the voltage present in each phase of an electric machine with reference to ground, or an area to which a fault is likely to short (e.g., the case of the machine). The sensed voltages can be a rectified DC signal, which represents a voltage proportional to the AC voltage present in the sensed phase windings. The sensed voltages can be averaged to generate an average voltage, which can be used to determine if any one of the phase voltage is significantly different from the other phases in the system. For each phase to be monitored for fault, the sensed voltage of that phase can be compared to the average voltage of all phases. If a fault exists, the sensed voltage between that phase and ground (e.g., the machine case) will be significantly lower than if no fault existed. The sensed voltage will also be significantly lower than the average voltage across all phases, and a simple comparator circuit can be used to energize an alarm signal indicating a fault exists for the phase being monitored. This can provide an advanced warning system, indicating a fault prior to detection by conventional sensors.

Figure 1:
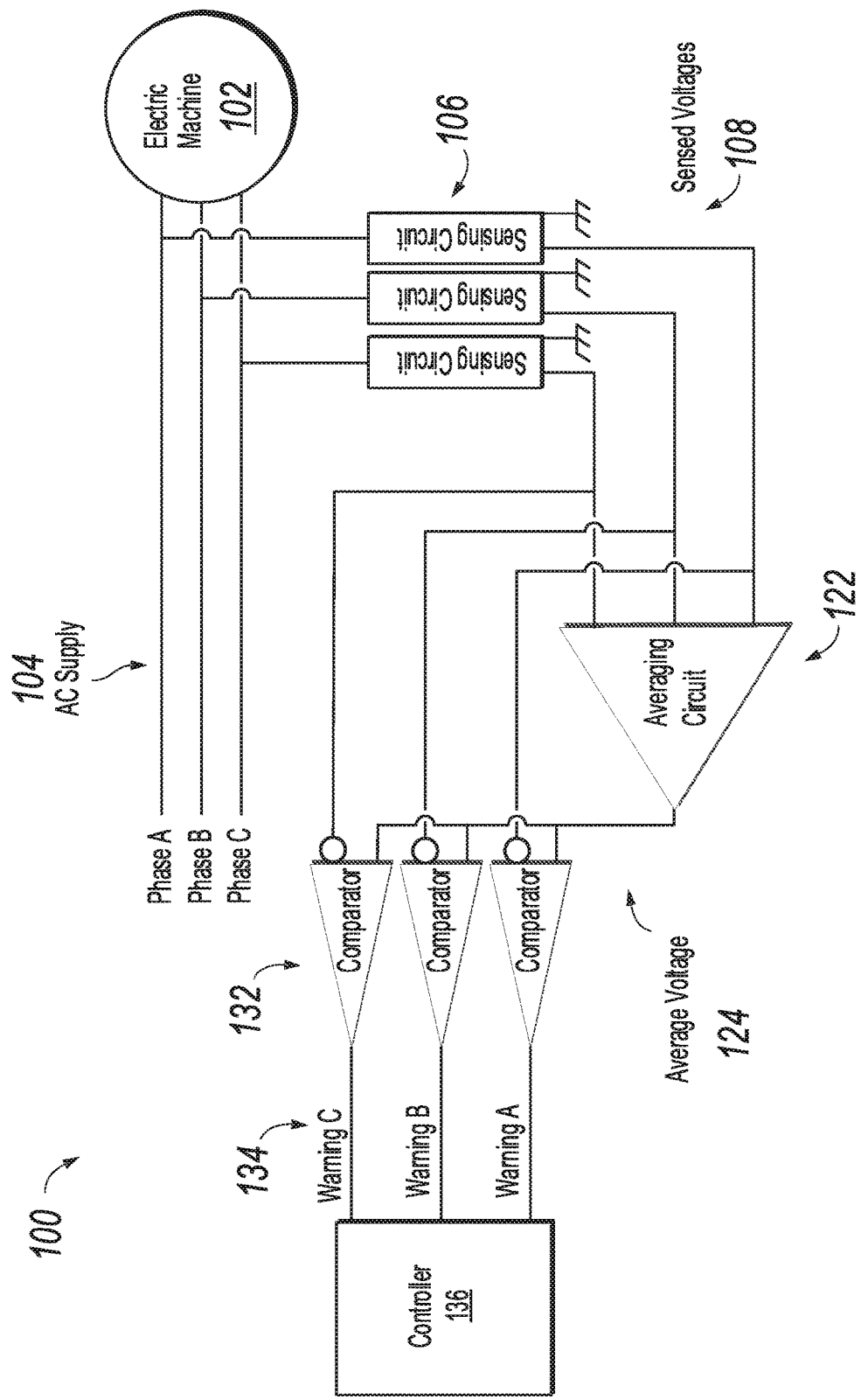
FIG. 1 depicts a simplified circuit diagram for detecting faults in a multi-phase electric machine.

Turning to the illustrated example implementation, FIG. 1 is a simplified circuit diagram of a system 100 for detecting faults in a multi-phase electric machine. The electric machine 102 can be, for example, a generator, an electric motor (permanent magnet synchronous motor, reluctance motor, inductance motor, etc.). The electric machine is powered from a multi-phase AC supply 104, which provides power to the electric machine 102. While depicted as a 3-phase supply in FIG. 1, any suitable multi-phase system is within the scope of this disclosure. For example, 6-phase, 12-phase or other combination of AC power to the electric machine 102 is contemplated. In some implementations the electric machine can be a high speed electric machine which has a prime mover that rotates at a high speed (e.g., 5,000 rpm, or 120,000 rpm etc.).

Each phase has an associated sensing circuit 106, which sense the phase voltage with reference to ground, and converts it to a unipolar DC signal suitable for further analysis. In some implementations, the sensing circuits 106 are directly wired into each individual phase of the AC supply 104. In some implementations, the sensing circuits 106 are inductively coupled to each phase of the AC supply 104. The sensing circuits 106 output a sensed voltage 108. The sensed voltage 108 can be a DC signal (e.g., ripple DC, or rectified DC) that is a function of the amplitude of the AC voltage for the associated phase with respect to ground. In some implementations, the sensing circuits 106 attenuate the AC voltage to a voltage suitable for use in digital electronics. For example, a sensing circuit can attenuate a 240 VAC line voltage to a 5V DC signal. A more detailed example of a sensing circuit 106 is described below with reference to FIG. 2.

Figure 2:
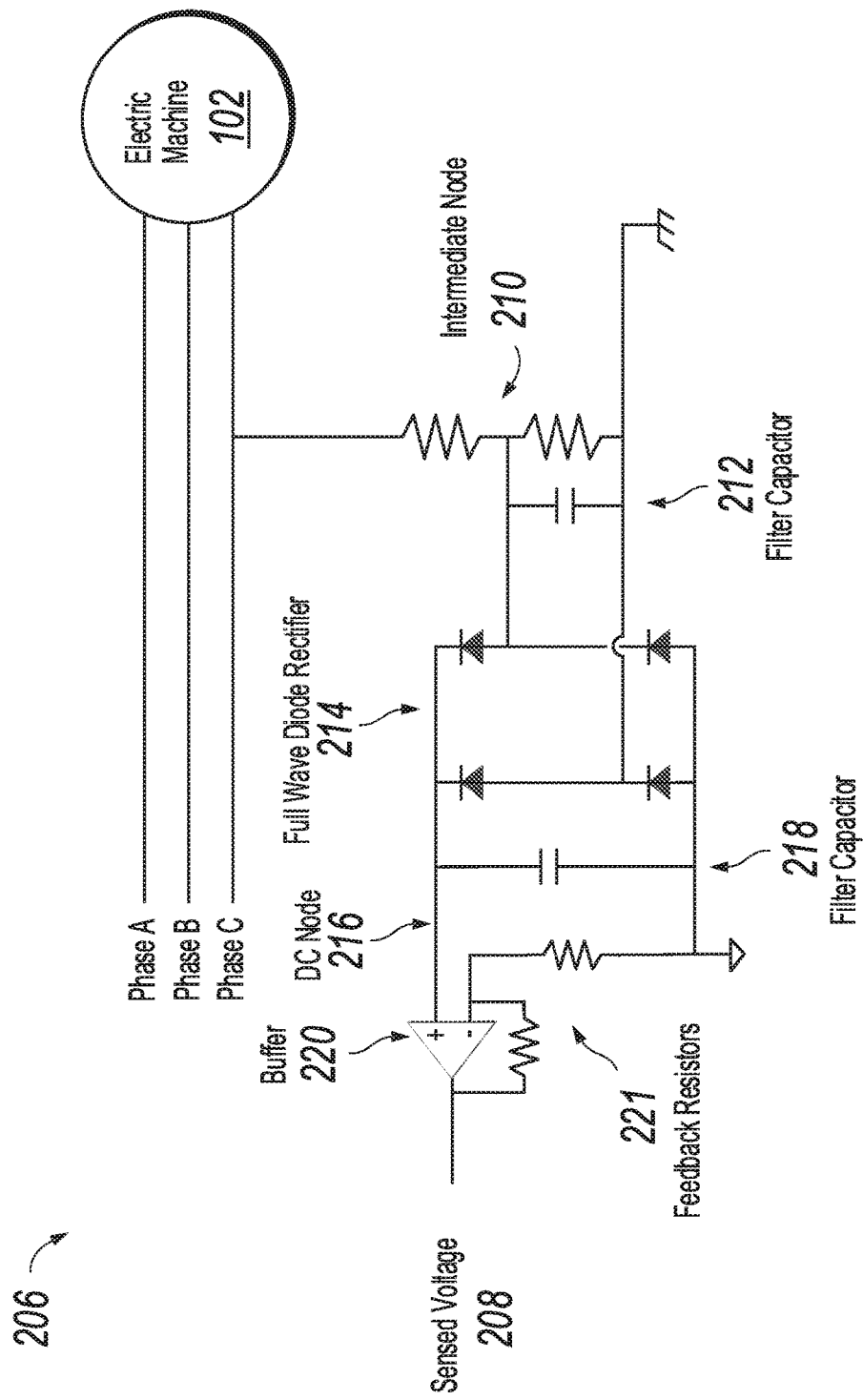
FIG. 2 depicts a sensing circuit for sensing a voltage present in a single phase of an electric machine.

FIG. 2 depicts an example sensing circuit 206, which can be similar to, or different from the sensing circuits 106 depicted in FIG. 1. Each sensing circuit detects a voltage present in each phase of the multi-phase electric machine 102. A voltage divider can be electrically connected to a single phase of the electric machine 102 and can provide an intermediate node 210 which has an attenuated voltage compared to the voltage present in the sensed phase. For example, if the voltage referenced to ground in the depicted phase C is a 240V, 60 Hz, AC voltage, than the signal at the intermediate node 210 can be a 5V 60 Hz AC signal based on the impedance of the resistors in the voltage divider. Additionally a filter capacitor 212 can be connected between the intermediate node 210 and the referenced ground. The filter capacitor 212 can behave as a low-pass filter, and effectively reduce high frequency noise in at the intermediate node 210. The attenuated, filtered signal at the intermediate node 210 can then be passed through full wave diode rectifier 214.

The full wave diode rectifier 214 converts the AC signal at the intermediate node to a DC voltage at the DC node 216. An additional filter capacitor 218 can be connected between the DC node 216 and the analog ground of the sensing circuit and can filter and smooth the DC voltage produced by the full wave diode rectifier 214.

The DC node 216 can be connected to the non-inverting terminal of an operational amplifier acting as a high impedance buffer 220. The buffer 220 can output a sensed voltage 208 that is substantially equal to the voltage present at the DC node 216, without drawing significant current from the full wave diode rectifier 214 or the filter capacitor 216. The buffer 220 can include feedback resistors 221 which can be selected to provide a gain between the voltage at the DC node 216 and the sensed voltage 208. In some implementations, the feedback resistors 221 are selected to provide a unity gain, such that the sensed voltage is equal to the voltage at the DC node 216. In some implementations, different gain values are selected (e.g., 2, or 0.5).

Returning to FIG. 1, the sensed voltages 108 from each sensing circuit 106 can then be averaged using an averaging circuit 122. The averaging circuit 122 can be, for example, an active averaging circuit including an operational amplifier and additional components. In some implementations, the averaging circuit can be a simple balanced resistor setup, configured of exclusively passive components. An example averaging circuit is described below with reference to FIG. 3.

Figure 3:
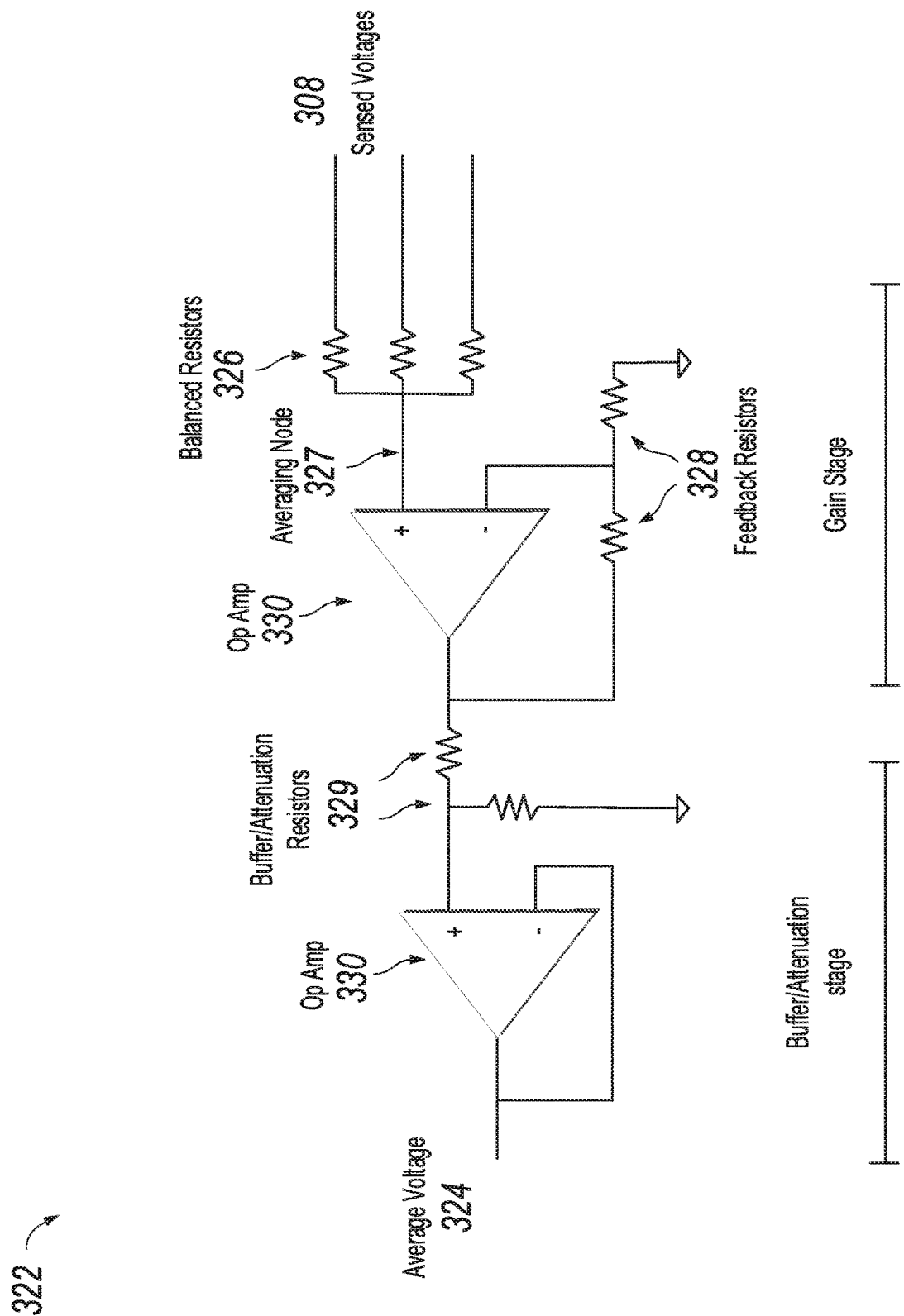
FIG. 3 depicts an example averaging circuit, for providing an average voltage signal for a number of input voltage signals.

FIG. 3 depicts an example averaging circuit, for providing an average voltage signal for a number of input voltage signals. Each input sensed voltage 308 is passed through a balanced resistor 326 to a shared averaging node 327. Each resistor of the balanced resistor 326 is selected to have a resistance that matches the rest of the resistors. The averaging node 327 can then be connected to the noninverting terminal of operational amplifier 330 which outputs an average voltage 324 that can be a function of the voltage present at the averaging node 327. Feedback resistors 328 can be selected to give the averaging circuit an overall gain and the buffer resistors 329 for overall attenuation, for example 0.9 to ensure that under normal operation the average voltage 324 is lower than each individual sensed voltage 308 an attenuation and buffer stage is required. An example equation describing the voltage present at the output of the averaging circuit for a three phase implementation is:

$$V_{Average} = \frac{0.9*(Va+Vb+Vc)}{3}.$$

Note that while a two stage averaging circuit is depicted in FIG. 3, with a gain stage followed by a buffer and attenuation stage, any suitable means for generating an average voltage is contemplated in the present disclosure. For example, a completely passive circuit, comprising only three balanced resistors and an averaging node is possible in some implementations.

Returning to FIG. 1 the averaging voltage 124 can be provided as input to the comparators 132. While three comparators are depicted in FIG. 1, one for each phase, more or less comparators are contemplated. For example, in an implementation where faults are to be detected in a six phase machine, and where reliable indication is important, 12 comparators could be used. In this implementation, each of the six phases could have a pair of associated comparators to provide redundant indication of a fault. Each comparator accepts the average voltage 124 as a reference input, and compares with a sensed voltage 108 associated with a particular phase of the electric machine 102. The comparators 132 can be clocked or continuous and each comparator can have an internal hysteresis to minimize or eliminate state switching due to noise present in the sensed voltages 108 or the average voltage 124. In some implementations, a custom hysteresis can be configured based on additional feedback resistors (not shown) in each comparator circuit. The hysteresis can be determined such that the comparators 132 will only output a warning signal 134 if a fault is present in the associated phase. For example, the hysteresis can be configured such that a difference between the average voltage 124 and a particular sensed voltage 108 of greater than 10% will be considered a fault.

The comparators 132 can each output a warning signal 134. In some implementations, a particular comparator 132 outputs a digital high (e.g. 3.3V or 5V, etc.) when a particular sensed voltage 108 drops below the average voltage 124 by greater than the hysteresis amount of the associated comparator 132. In this manner, a signal is generated that indicates both that a fault exists in the system and the particular phase in which the fault exists.

In some implementations, the warning signals 134 can be provided as input to a controller 146, which can interpret the warning signals 134 and take appropriate action. For example, the controller 136 can be configured to relay a warning signal 134 to a user in the event of a fault. For instance, the controller 136 can illuminate a warning light associated with the faulted phase, or activate an audible alarm. In some implementations, the controller can be connected to a network and be, for example, and internet-of-things (IoT) device. In these implementations, the controller can send a notification, email, or SMS message to predetermined users upon receipt of a warning signal. In some implementations the controller 136 can monitor and record faults, the controller 136 can record each time a warning is active, allowing review of data that can reveal patterns. For example, if the controller records a fault for Warning C for two hours every morning, a user may be able to determine, based on the pattern, that phase C is faulting due to morning dew because the electric machine 102 is located outside.

The controller 136 can additionally be configured to take action without user intervention. In some implementations the controller 136 can shut down the electric machine 102. For example, if a single warning signal 134 is received, the controller 136 may initiate a warning or an audible alert, but upon receipt of two or more simultaneous warning signals 134 (e.g., two phases have shorted) the controller 136 can deactivate the AC supply 104 and minimize or eliminate damage to the electric machine 102 or other components in the system.

System 100 as described can detect ground faults in an AC machine. For example, assume there is a winding-to-ground fault in phase C of electric machine 102 that shorts half of the phase C windings to the machine case. Since the sensing circuit 106 for phase C measures a voltage between the phase C windings at the AC supply 104 and chassis ground (e.g., the machine case) the voltage measured by the sensing circuit 106 associated with phase C will be significantly reduced. Nominally it will be reduced by about 50% of its original value if half of the phase windings are shorted. The phase A and phase B sensing circuits 106 will continue to measure normal voltages, or slightly different voltages (as they're now sensing the voltage between phase A or B and ground which has some faulted voltage from phase C).

The average voltage will be reduced, but only by a fraction of the amount the individual sensed voltage is reduced, and so compared to the new average voltage, the phase C sensed voltage will be low and warning C will be energized by its associated comparator 132.

System 100 can also detect turn to turn faults in an AC machine, if that AC machine is a permanent magnet AC motor. For example, assume there is a turn to turn fault in phase C of electric machine 102 which shorts some turns of the phase C turn windings, resulting in an effective reduction in turns in phase C, that phase will no longer generate as much induced voltage or back electro-motive force (EMF). This will result in an unbalanced voltage in the faulted phase, and be detected by the system 100.

Figure 4:
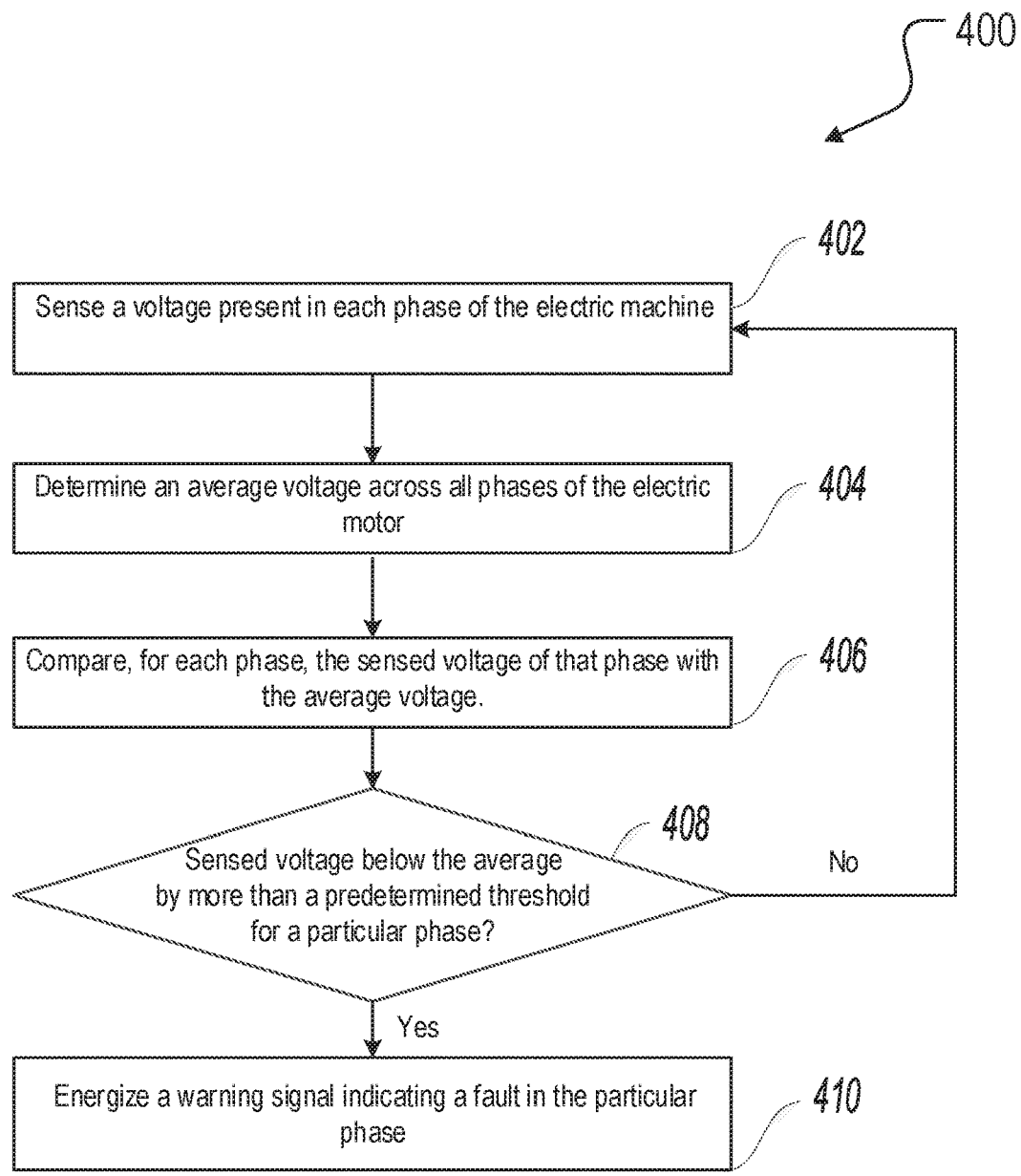
FIG. 4 is a flowchart describing a method for detecting faults in an electric machine.

FIG. 4 is a flow diagram of an example method 400 for detecting faults in an electric machine. FIG. 4 is an example method illustrated as being executed by a circuit such as system 100 of FIG. 1. However, it will be understood that method 400 may be performed, for example, by any other suitable system, environment, software, and hardware, or a combination of systems, environments, software, and hardware as appropriate.

At 402, a voltage present in each phase of a multi-phase electric machine is sensed. The voltage can be sensed using a sensing circuits similar to sensing circuit 206 described with respect to FIG. 2. The sensed voltages can be a DC voltage signal that is a function of the voltage (e.g., the amplitude of the AC voltage) present in each phase of the electric machine.

At 404, an average of all the sensed voltages is determined. The average voltage can be determined by a circuit similar to averaging circuit 322 as described with reference to FIG. 3. The determined average can be multiplied by a gain, or correction factor. In some cases the average voltage is multiplied by a gain of less than one, in order to ensure that during normal operation the sensed voltages associated with each phase of the electric machine are higher than the determined average. In some implementations, the average voltage is determined using software. For example, a microcontroller can receive the sensed voltages as inputs, and conduct the averaging via software executing on the microcontroller.

At 406, each sensed voltages is compared with the average voltage. This comparison can be conducted by a circuit such as a group of comparators similar to comparators 132 described with reference to FIG. 1. In some implementations, the comparison is conducted by software, and the sensed voltages and average voltage is received as input to, for example, a microcontroller executing comparison software.

At 408, a determination is made as to whether or not the sense voltage for a particular phase is below the average voltage by greater than a predetermined threshold. For example, if a comparator circuit is used, the comparator can have an associated hysteresis which sets a threshold below which the comparator will not trigger. The predetermined threshold can be selected to ensure a warning is given in the event of a fault, but minimize or eliminate warnings due to system noise, or transient voltages present. If it is determined that a sensed voltage is less than the average voltage by more than the predetermined threshold, then method 400 proceeds to 410.

At 410, a warning signal is energized indicating the presence of a fault in the electric machine. In some implementations, the warning signal is a digital signal which can be used as input to control software or other system. In some implementations, the warning signal merely energizes a warning light, giving a user a visual indication that a fault has been detected. Each individual phase can have its own warning signal (or multiple warning signals) to indicate the precise location of the fault in the machine.

Returning to 408, if it is determined that no sensed voltage is below the average voltage by more than the predetermined threshold, method 400 can return to 402, sensing voltages again and monitoring for future faults. In some implementations, method 400 is carried out in a continuous manner (e.g., by an analog circuit). In some implementations, method 400 is executed as software and carried out in a discrete manner (e.g., executed by a clock cycle very 10 ms).

The preceding figures and accompanying description illustrate example processes and techniques. However, system 100 (or its software or other components) contemplates using, implementing, or executing any suitable technique for performing these and other tasks. It will be understood that these processes are for illustration purposes only and that the described or similar techniques may be performed at any appropriate time, including concurrently, individually, or in combination. In addition, many of the operations in these processes may take place simultaneously, concurrently, and/or in different orders than as shown. Moreover, the described systems and flows may use processes and/or components with or perform additional operations, fewer operations, and/or different operations, so long as the methods and systems remain appropriate.

In other words, although this disclosure has been described in terms of certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

The invention claimed is:

1. A system for identifying a fault in a multi-phase electric machine, the system comprising:
    a plurality of sensing circuits, each sensing circuit configured to provide a sensed voltage that corresponds to a voltage referenced to ground in a particular phase winding of the electric machine;
    an averaging circuit configured to produce an average voltage that represents an average of the plurality of sensed voltages; and
    a plurality of comparators, each comparator configured to receive inputs of (1) the sensed voltage provided by a particular sensing circuit of the plurality of sensing circuits and (2) the average voltage produced by the averaging circuit, wherein the comparator outputs a signal if the sensed voltage input is lower than the average voltage input.

2. The system of claim 1, wherein the comparator outputs a logical high if the sensed voltage input is lower than the average voltage input by greater than a predetermined threshold.

3. The system of claim 2, wherein the predetermined threshold is selected such that the logical high represents a fault in the particular phase associated with the sensed voltage of the sensing circuit corresponding to the comparator.

4. The system of claim 3, comprising a controller configured to initiate an action in response to receiving a logical high from one or more of the comparator outputs.

5. The system of claim 1, wherein the averaging circuit is an active averaging circuit, and wherein the active averaging circuit has an overall gain of less than 1.

6. The system of claim 1, wherein the sensing circuits each comprise:
    a voltage divider forming an intermediate node and comprising at least two resistors;
    a rectifier configured to convert bi-polar voltages to a single polarity voltage; and
    an operational amplifier, electrically connected to the single polarity voltage and configured to act as a buffer, accepting the single polarity voltage as input and outputting the sensed voltage.

7. The system of claim 6, comprising a capacitor connected between the intermediate node and ground, wherein the capacitor is configured to attenuate frequencies above a predetermined cutoff frequency.

8. The system of claim 6, wherein the rectifier is a full wave, diode rectifier comprising a filter capacitor.

9. The system of claim 1, wherein the sensed voltages provided by the sensing circuits are proportional to the voltage in the particular phase winding.

10. A method for detecting a fault in a multi-phase electric machine, the method comprising:
    sensing, with a plurality of sensing circuits, a voltage referenced to ground associated with each phase of the electric machine;
    determining, with an averaging circuit, an average voltage across all the sensed voltages;
    comparing, with a comparing circuit and for each phase, the sensed voltage associated with the phase to the average voltage; and
    in response to determining a sensed voltage for a particular phase is less than the average voltage across all phases by a predetermined threshold, outputting, by the comparing circuit, a warning signal indicating a fault in the particular phase.

11. The method of claim 10, wherein each sensing circuit comprises:
    a voltage divider forming an intermediate node and comprising at least two resistors;
    a rectifier configured to convert bi-polar voltages to a single polarity voltage; and
    an operational amplifier, electrically connected to the single polarity voltage and configured to act as a buffer, accepting the single polarity voltage as input and outputting the sensed voltage.

12. The method of claim 11, wherein each sensing circuit further comprises:
    a capacitor connected between the intermediate node and ground, wherein the capacitor is configured to attenuate frequencies above a predetermined cutoff frequency.

13. The method of claim 11, wherein the rectifier is a full wave, diode rectifier comprising a filter capacitor.

14. The method of claim 10, wherein the predetermined threshold is selected to provide fault indication for a turn to turn fault in the electric machine.

15. The method of claim 14, wherein the predetermined threshold is selected to provide a fault indication for a turn to turn fault if 50% or more of a phase's windings are faulted.

16. The method of claim 10, wherein determining the average voltage across all phases of the electric machine comprises:
    providing the sensed voltages for each phase to an averaging circuit is, wherein the averaging circuit is an active averaging circuit with an overall gain of less than 1.

17. A fault detection circuit comprising:
    at least two sensing circuits, each sensing circuit configured to provide a sensed voltage that corresponds to a voltage referenced to ground in a particular phase winding of a multi-phase electric machine;

an averaging circuit configured to produce an average voltage that represents an average of the at least two sensed voltages; and at least two comparator circuits, each comparator circuit configured to receive inputs of the average voltage as reference and a particular sensed voltage of the at least two sensed voltages, wherein the comparator is configured to output a signal if the particular sensed voltage is lower than the average voltage.

18. The fault detection circuit of claim 17, wherein the signal is a logical high, wherein the comparator outputs the logical high if the particular sensed voltage is lower than the average voltage by a predetermined threshold, and wherein the predetermined threshold is selected such that the logical high represents a fault in the particular phase winding of the multi-phase electric machine.

19. The fault detection circuit of claim 17, comprising a controller circuit configured to initiate an action in response to receiving a signal from one or more of the at least two comparators.

20. The fault detection circuit of claim 17, wherein each sensing circuit comprises:

a voltage divider forming an intermediate node and comprising at least two resistors and a capacitor, wherein the capacitor is configured to attenuate input frequencies above a predetermined cutoff frequency;

a full wave, diode rectifier configured to convert bi-polar voltages to a single polarity voltage and comprising a filter capacitor; and an operational amplifier, electrically connected to the single polarity voltage and configured to act as a buffer, accepting the single polarity voltage as input and outputting the sensed voltage.

* * * * *